(12) United States Patent
Haraguchi

(10) Patent No.: US 7,986,170 B2
(45) Date of Patent: Jul. 26, 2011

(54) SAMPLE-AND-HOLD CIRCUIT AND CCD IMAGE SENSOR

(75) Inventor: Yoshizumi Haraguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 125 days.

(21) Appl. No.: 12/407,321

(22) Filed: Mar. 19, 2009

(65) Prior Publication Data

US 2009/0237120 A1 Sep. 24, 2009

(30) Foreign Application Priority Data

Mar. 19, 2008 (JP) ................................. 2008-071910

(51) Int. Cl.
*G11C 27/02* (2006.01)
(52) U.S. Cl. .......................................... 327/94; 327/91
(58) Field of Classification Search .................... 327/91, 327/94
See application file for complete search history.

(56) References Cited

U.S. PATENT DOCUMENTS

| 6,577,168 B1* | 6/2003 | Kakitani | 327/94 |
| 2007/0013417 A1* | 1/2007 | Lim | 327/94 |
| 2009/0237120 A1* | 9/2009 | Haraguchi | 327/94 |
| 2010/0194441 A1* | 8/2010 | Wang | 327/94 |

FOREIGN PATENT DOCUMENTS

| JP | 61-8799 | 1/1986 |
| JP | 2-302999 | 12/1990 |

* cited by examiner

*Primary Examiner* — Lincoln Donovan
*Assistant Examiner* — Ryan C Jager
(74) *Attorney, Agent, or Firm* — Young & Thompson

(57) ABSTRACT

Noise is more effectively reduced in one circuit. When sampling and holding is performed, switching of an ON resistance of MOS transistors (MSH1 and MSH2) that are for sampling is made in two or more stages according to speed of sampling. Here, a level adjustment circuit (20) is provided that generates sample-and-hold pulse signals (φSH1S and φSH2S), which vary voltage to enable switching the ON resistance of the MOS transistors (MSH1 and MSH2), to be provided to gates of the MOS transistors (MSH1 and MSH2).

17 Claims, 10 Drawing Sheets

FIG. 2

| MODE | EXTERNAL VOLTAGE SUPPLY ※ | | | | | | | | | SWITCH Tr OPERATION | | | | | |
|---|---|---|---|---|---|---|---|---|---|---|---|---|---|---|---|
| | VSW1 | VSW2 | VSW3 | VSH1L※※ | VSH2L※※ | VSW4 | VSW5 | VC1 | VC2 | M1 | M2 | M3 | M8 | M9 |
| MAXIMUM SPEED | HIGH | LOW | HIGH | BETWEEN Vt1 AND GND | BETWEEN Vt2 AND GND | LOW | LOW | ARBITRARY | ARBITRARY | ON | OFF | ON | OFF | OFF |
| HIGH SPEED | HIGH | HIGH | LOW | BETWEEN Vt1 AND GND | GND | LOW | LOW | ARBITRARY | ARBITRARY | ON | ON | OFF | OFF | OFF |
| MEDIUM SPEED | LOW | HIGH | HIGH | GND | GND | HIGH | HIGH | LOW | LOW | OFF | ON | ON | ON | ON |
| LOW SPEED | LOW | HIGH | HIGH | GND | GND | HIGH | HIGH | HIGH | HIGH | OFF | ON | ON | ON | ON |
| ULTRA-LOW SPEED | LOW | HIGH | LOW | GND | GND | HIGH | HIGH | HIGH | HIGH | OFF | ON | OFF | ARBITRARY | ON |

※LOW, HIGH OF VC1 AND VC2 CORRESPOND TO LOW, HIGH OF FIG. 10. VSW1 TO VSW5 ARE SET TO SWITCHABLE LOW, HIGH.

※※Vt1, Vt2 INDICATE THRESHOLD VOLTAGE OF SAMPLE-AND-HOLD TRANSISTORS MSH1, MSH2, RESPECTIVELY.

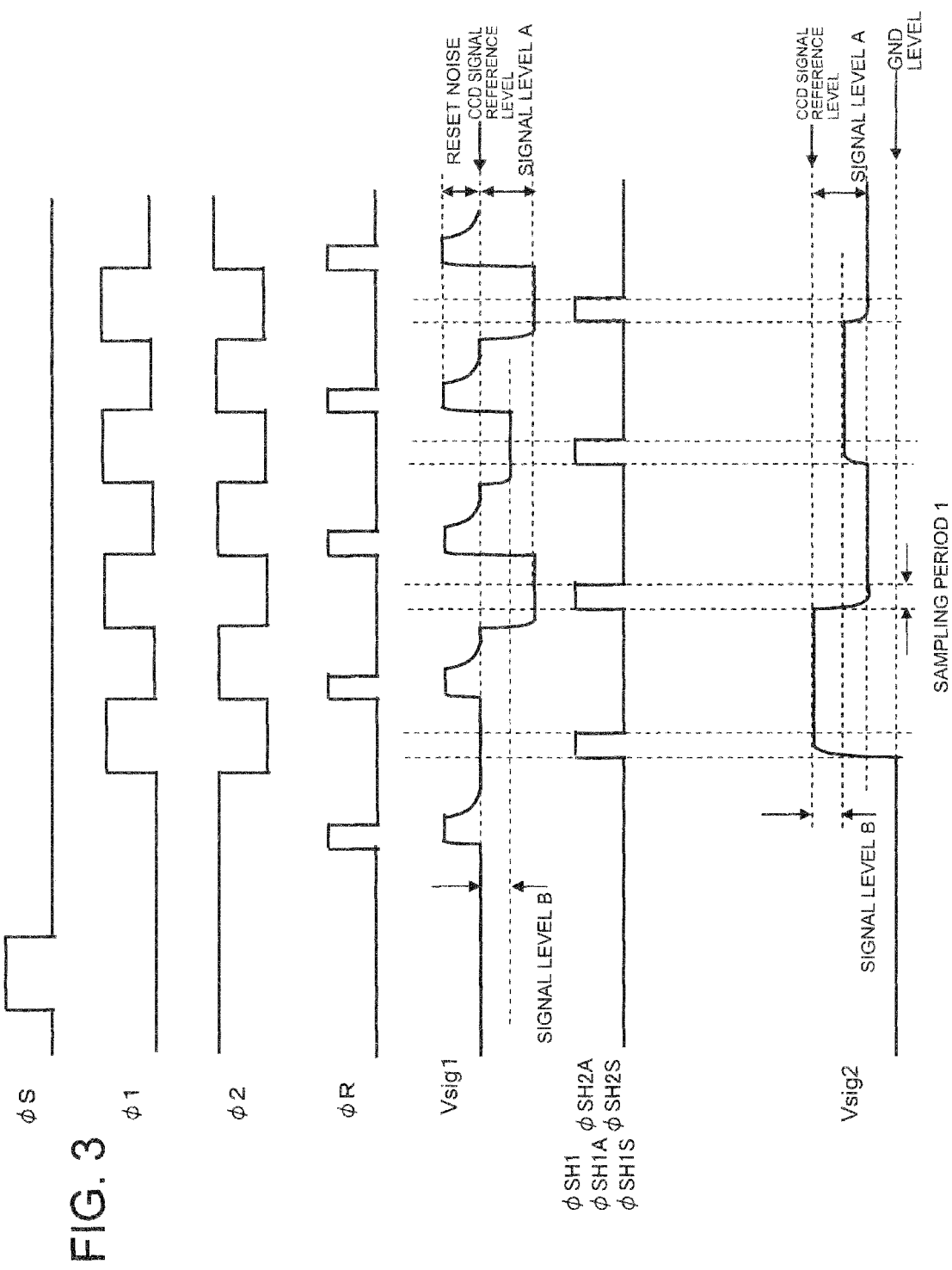

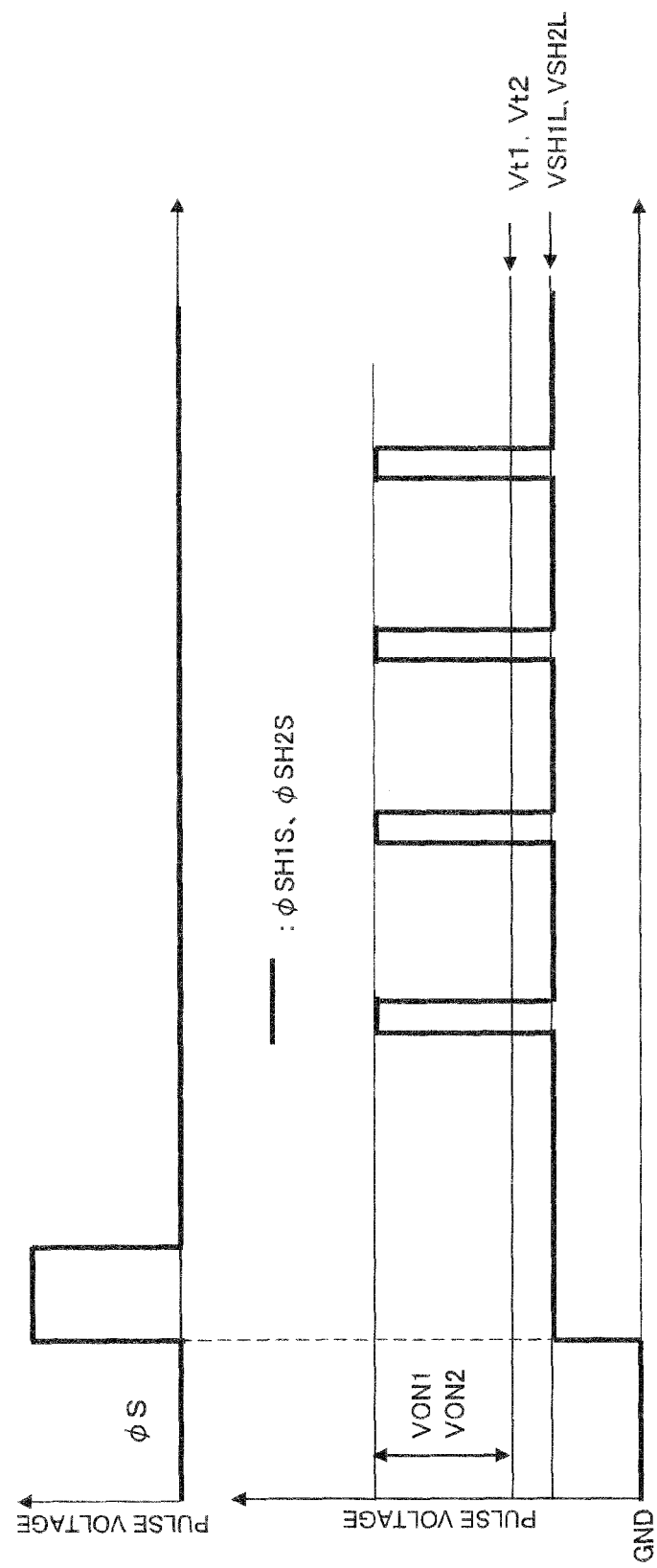

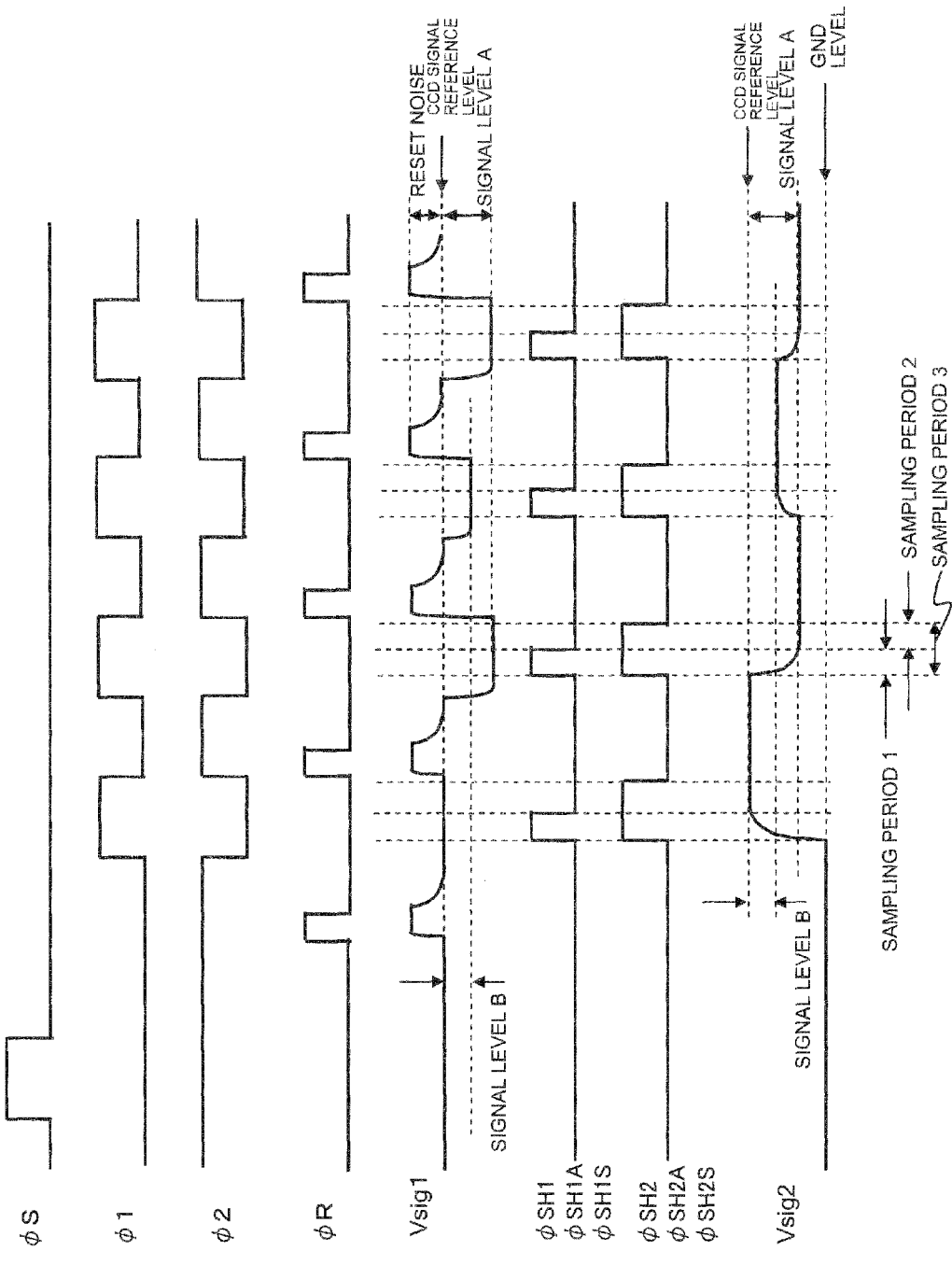

SAMPLE-AND-HOLD CIRCUIT AND CCD IMAGE SENSOR

REFERENCE TO RELATED APPLICATION

This application is based upon and claims the benefit of the priority of Japanese patent application No. 2008-071910 filed on Mar. 19, 2008, the disclosure of which is incorporated herein in its entirety by reference thereto.

TECHNICAL FIELD

The present invention relates to a sample-and-hold circuit and to a CCD image sensor using the sample-and-hold circuit.

BACKGROUND

A sample-and-hold circuit is a circuit which performs sampling of an input signal by a switch element such as a MOS transistor or the like, to be held in a capacitor element for holding, and is widely used. In the sample-and-hold circuit with this type of simple configuration, there is a disadvantage in that noise picked up when sampling is performed becomes large, and S/N ratio is bad. In addition, there is a disadvantage in that crosstalk occurs between a sampling pulse signal and a hold signal.

Consequently, a sample-and-hold circuit is disclosed in which 2 switch elements for sampling are connected in parallel, and timing at which respective switch elements are turned ON is made different. For example, Patent Document 1 describes a sample-and-hold circuit which switches a time constant of a time constant switching means during a signal extraction period by control of a timing control circuit. More specifically, in a first sampling period and a second sampling period following the first sampling period, sampling is performed by changing a value (i.e., giving different value) of a resistor connected in series to each of the switch elements, and noise is reduced.

Patent Document 2 describes a sample-and-hold circuit that is provided with a first and a second transmission gate for sampling, and a delay circuit which delays a signal applied to a control input terminal of the first transmission gate, to be received by a control input terminal of the second transmission gate, and is configured such that gate width of an MOS transistor for a second transmission gate switch is smaller than gate width of an MOS transistor for a first transmission gate switch. According to this type of sample-and-hold circuit, a transmission gate configured by the MOS transistor with the small gate width is ON at an instant at which a transmission gate configured by the MOS transistor with a large gate width is OFF, and it is possible to lower impedance of a hold capacitor terminal, and reduce crosstalk of the sampling pulse signal.

[Patent Document 1]
JP Patent Kokai Publication No. JP-A-61-8799
[Patent Document 2]
JP Patent Kokai Publication No. JP-A-02-302999

SUMMARY

The entire disclosures of Patent Documents 1 and 2 are incorporated herein by reference thereto.

The following analyses are given by the present invention.

In recent years, in CCD image sensors, along with smaller light receiving pixels and increased reading speed, a need has arisen for dealing with smaller signal output with regard to pixel signals. Consequently, a method is being adopted in which a voltage amplification circuit is built-in in a CCD chip, and smaller signal output is dealt with. In addition, in some image reading apparatuses (copy machines and the like) that use a CCD image sensor, speeding up of reading is progressing, and there is an urgent need to deal with speeding up of voltage amplification circuits As one such method, an output period of a signal is lengthened by sampling and holding, and higher speeds are handled However, if a high speed sample-and-hold circuit is used, a high frequency noise component such as heat noise and the like added to an output signal may be introduced and deterioration of image quality may occur. Consequently, reduction of this noise component is required.

However, with regard to the image reading apparatuses that use the CCD image sensor, there exist a range of types, from high speed to comparatively low speed. Therefore, when a high speed CCD image sensor is used in a low speed image reading apparatus, unnecessary high frequency noise is also introduced. Consequently, in order to improve image quality of low speed apparatuses, there has been a need to remove high frequency components by reduction of speed of the voltage amplification circuits in the CCD chips (development of a separate product for low speeds) or addition of a filter circuit.

With regard to sample-and-hold circuits for this type of CCD image sensor, conventionally only time constant switching according to a specific drive frequency was possible. Therefore, when a circuit designed to handle high speeds is driven at medium speeds or low speeds, there is only a high frequency band limitation the same as when used at high speeds, so that there is a limit to noise reduction, and adequate noise reduction is not carried out.

In one aspect of the present invention, there is provided a sample-and-hold circuit is configured to enable switching in two or more stages according to speed of sampling, of an ON resistance of a switch element for sampling when performing sampling and holding. In another aspect of the present invention, there is provided a sample-and-hold circuit that comprises means for switching in two or more stages according to speed of sampling, of an ON resistance of a switch element for sampling when performing sampling and holding. In a further aspect, there is provided a CCD image sensor that comprises a CCD and the sample-and-hold circuit according to the foregoing aspects.

The meritorious effects of the present invention are summarized as follows.

According to the present invention, since it is possible to switch in two or more stages according to speed of sampling, an ON resistance of a switch element for sampling, a band limitation according to speed of sampling is possible, and noise reduction can be performed more efficiently by one circuit.

BRIEF DESCRIPTION OF THE DRAWINGS

FIG. 2 is a view showing a mode setting example according to sampling speed.

FIG. 3 is a timing chart of each part in a maximum speed mode.

FIG. 4 is a drawing showing a waveform of gate voltage of a transistor for sampling and holding in the maximum speed mode.

FIG. 5 is a timing chart of each part in a nigh speed mode.

PREFERRED MODES

Figure 1:
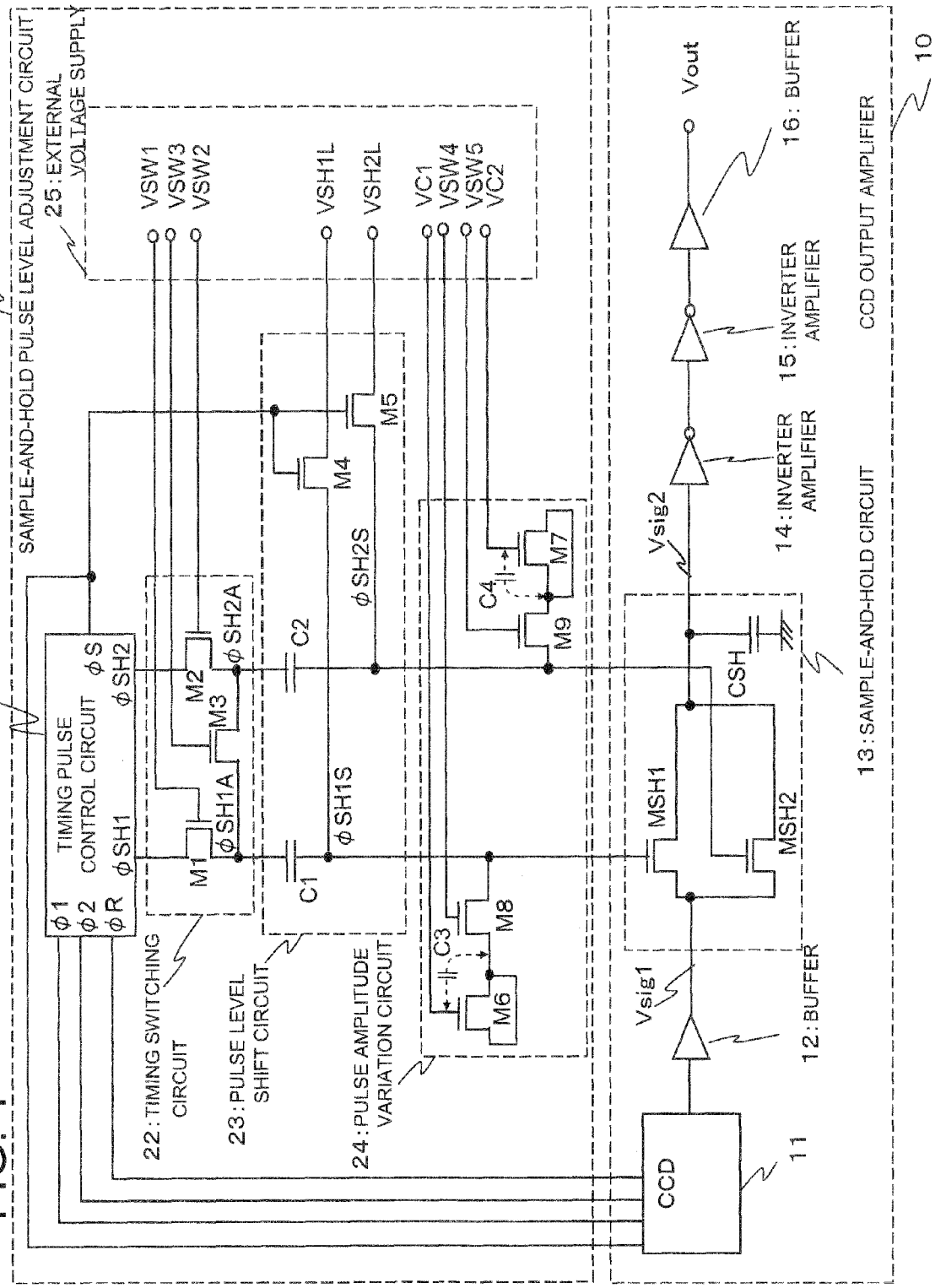
FIG. 1 is a circuit diagram of a sample-and-hold circuit according to an exemplary embodiment of the present invention.

A sample-and-hold circuit according to an exemplary embodiment of the present invention is configured to enable switching in two or more stages according to speed of sampling, of an ON resistance of a switch element such as a MOS transistor or the like for sampling, when sampling and holding is being carried out. Here, a level adjustment circuit may be provided that generates a sample-and-hold pulse signal which varies voltage to enable switching the ON resistance of the MOS transistor, and provides the signal to a gate of the MOS transistor.

The sample-and-hold circuit of the invention may be provided with at least two MOS transistors, and the level adjustment circuit may individually control gate voltage of each of the MOS transistors.

In the sample-and-hold circuit of the present invention, the level adjustment circuit may generate a sample-and-hold pulse signal that has an amplitude and level corresponding to each speed classification of a sampling.

In the sample-and-hold circuit of the present invention, the level adjustment circuit may perform a level shift of each of a first and a second timing pulse signal, and also, with the sample-and-hold pulse signal with amplitude attenuated or as it is, may enable variation of level shift amount and/or amplitude attenuation amount of the sample-and-hold pulse signal in accordance with the speed classification of the sampling.

In the sample-and-hold circuit of the present invention, the level adjustment circuit may perform setting such that the first and the second timing pulse signals are an identical signal.

In the sample-and-hold circuit of the present invention, the level adjustment circuit may perform a setting such that the first and the second timing pulse signals are signals of different pulse widths made active at the same timing.

In a CCD image sensor of the present invention, a CCD and the abovementioned sample-and-hold circuit that samples and holds an output signal of the CCD may be provided.

According to the sample-and-hold circuit as described above, a configuration is such that the ON resistance of the switch element for sampling can be changed, and it is possible to select a sampling time constant in accordance with a drive frequency of the CCD image sensor. In addition, the change of the ON resistance of the switch element is possible by only a setting of an external voltage, with respect to the level adjustment circuit. In this way, it is possible to apply high frequency band limitation within a range in which signal output is not attenuated, for various drive frequencies, and it is possible to adjust a noise level to a minimum in a feasible range in accordance with each drive frequency, without affecting a signal having a frequency the same as the drive frequency. Therefore, it is possible to ensure broad utility in accordance with drive speed of the CCD image sensor.

A detailed description is given below according to an exemplary embodiment, making reference to the drawings.

EXEMPLARY EMBODIMENT 1

FIG. 1 is a circuit diagram of a CCD image sensor according to an exemplary embodiment of the present invention. In FIG. 1, the CCD image sensor is formed of a CCD output amplifier 10 that amplifies an output signal transmitted from a CCD 11, and a level adjustment circuit 20 that supplies a sample-and-hold pulse signal to the CCD output amplifier 10.

The CCD output amplifier 10 is provided with the CCD 11, a buffer 12, a sample-and-hold circuit 13, inverter amplifiers 14 and 15, and a buffer 16, and outputs a signal outputted from the CCD 11, via the buffer 12, the sample-and-hold circuit 13, the inverter amplifiers 14 and 15, and the buffer 16, from output Vout. The sample-and-hold circuit 13 is provided with MOS transistors MSH1 and MSH2, and a capacitor element CSH for holding. Sample-and-hold pulse signals φSH1S and φSH2S outputted from a sample-and-hold pulse level adjustment circuit 20 are provided to a gate of each of the MOS transistors MSH1 and MSH2. The sample-and-hold circuit 13 samples a signal Vsig1, outputted from the CCD 11 and buffered by the buffer 12, by the MOS transistors MSH1 and MSH2, performs sample and holding in a capacitor element CSH, and outputs a signal Vsig2 that is held to an inverter amplifier 14.

The sample-and-hold pulse level adjustment circuit 20 is provided with a timing pulse control circuit 21, a timing switching circuit 22, a pulse level shift circuit 23, a pulse amplitude variation circuit 24, and an external voltage supply 25. With regard to one or both of the two pulse signals φSH1 and φSH2 outputted from the timing pulse control circuit 21, signal timing and level are converted via the timing switching circuit 22, the pulse level shift circuit 23 and the pulse amplitude variation circuit 24, and are provided to gates of the MOS transistors MSH1 and MSH2 as sample-and-hold signals φSH1S and φSH2S.

The timing pulse control circuit 21 outputs a shift pulse signal φS for reading a charge to a register from a photodiode in the CCD 11, clock signals φ1 and φ2 for CCD transfer, and a clock signal φR for resetting transferred charge. The sample-and-hold pulse signals φSH1 and φSH2 are outputted to the timing switching circuit 22. Furthermore, the shift pulse signal φS is outputted to the pulse level shift circuit 23.

The timing switching circuit 22 is provided with MOS transistors M1, M2 and M3. With regard to the MOS transistor M1, the sample-and-hold pulse signal φSH1 is provided to one end thereof, and the other end is connected to one end of the MOS transistor M3 and to one end of a capacitor C1 in the pulse level shift circuit 23, and a gate is connected to a terminal VSW1 of the external voltage supply 25. With regard to the MOS transistor M2, the sample-and-hold pulse signal φSH2 is provided to one end thereof, and the other end is connected to the other end of the MOS transistor M3 and to one end of a capacitor C2 in the pulse level shift circuit 23, and a gate is connected to a terminal VSW2 of the external voltage supply 25. A gate of the MOS transistor M3 is connected to a terminal VSW3 of the external voltage supply 25. The timing switching circuit 22 switches to provide, or not to provide, a pulse to be supplied to the gates of the sample-and-hold transistors MSH1 and MSH2, i.e., a pulse signal resulting from the signal φSH1 or φSH2, by (according to) a voltage of the terminals VSW1, VSW2, and VSW3.

The pulse level shift circuit 23 is provided with capacitor elements C1 and C2, and MOS transistors M4 and M5. The pulse level shift circuit 23 provides two signals φSH1A and φSH2A outputted from the timing switching circuit 22, respectively via the capacitor elements C1 and C2, to one end of each of the level shift MOS transistors M4 and M5. The other ends of the MOS transistors M4 and M5 are respectively connected to terminals VSH1L and VSH2L of the external voltage supply 25, and the signal φS is supplied to respective gates thereof. In the pulse level shift circuit 23, by turning the MOS transistors M4 and M5 ON by the signal φS, respective voltages of the terminals VSH1L and VSH2L are provided to other terminals of the capacitor elements C1 and C2.

The pulse amplitude variation circuit 24 is provided with MOS capacitors M6 and M7, and MOS transistors M8 and M9. The pulse signals φSH1S and φSH2S, which have undergone a level shift by the pulse level shift circuit 23, are supplied via the respective transistors M8 and M9 to the MOS capacitors M6 and M7 that have capacitances C3 and C4. Gates of the MOS transistors M8 and M9 are respectively connected to terminals VSW4 and VSW5 of the external voltage supply 25. In addition, the MOS capacitors M6 and M7 use capacitance between gate and substrate of a depletion-type MOS transistor (or have a capacitance bias dependence such as diffuse layer capacitance or the like), and gate terminals are respectively connected to the terminals VC1 and VC2 of the external voltage supply 25. In cases where the MOS transistor M8 is ON, the signal φSH1A is divided to the capacitor element C1 and the MOS capacitor M6, and is provided to the gate of the sample-and-hold transistor MSH1 as the signal φSH1S, and in cases where the MOS transistor M8 is OFF, is provided to the gate of the sample-and-hold transistor MSH1 as the signal φSH1S, without change. In cases in which the MOS transistor M9 is ON, the signal φSH2A is divided to the capacitor element C2 and the MOS capacitor M7, and is provided to the gate of the sample-and-hold transistor MSH2 as the signal φSH2S, and in cases in which the MOS transistor M9 is OFF, is provided to the gate of the sample-and-hold transistor MSH2 as the signal φSH2S, without change.

With regard to each terminal of the external voltage supply 25, a voltage level is set, as shown in FIG. 2, in accordance with an operation mode related to speed of the CCD image sensor.

Figure 7:
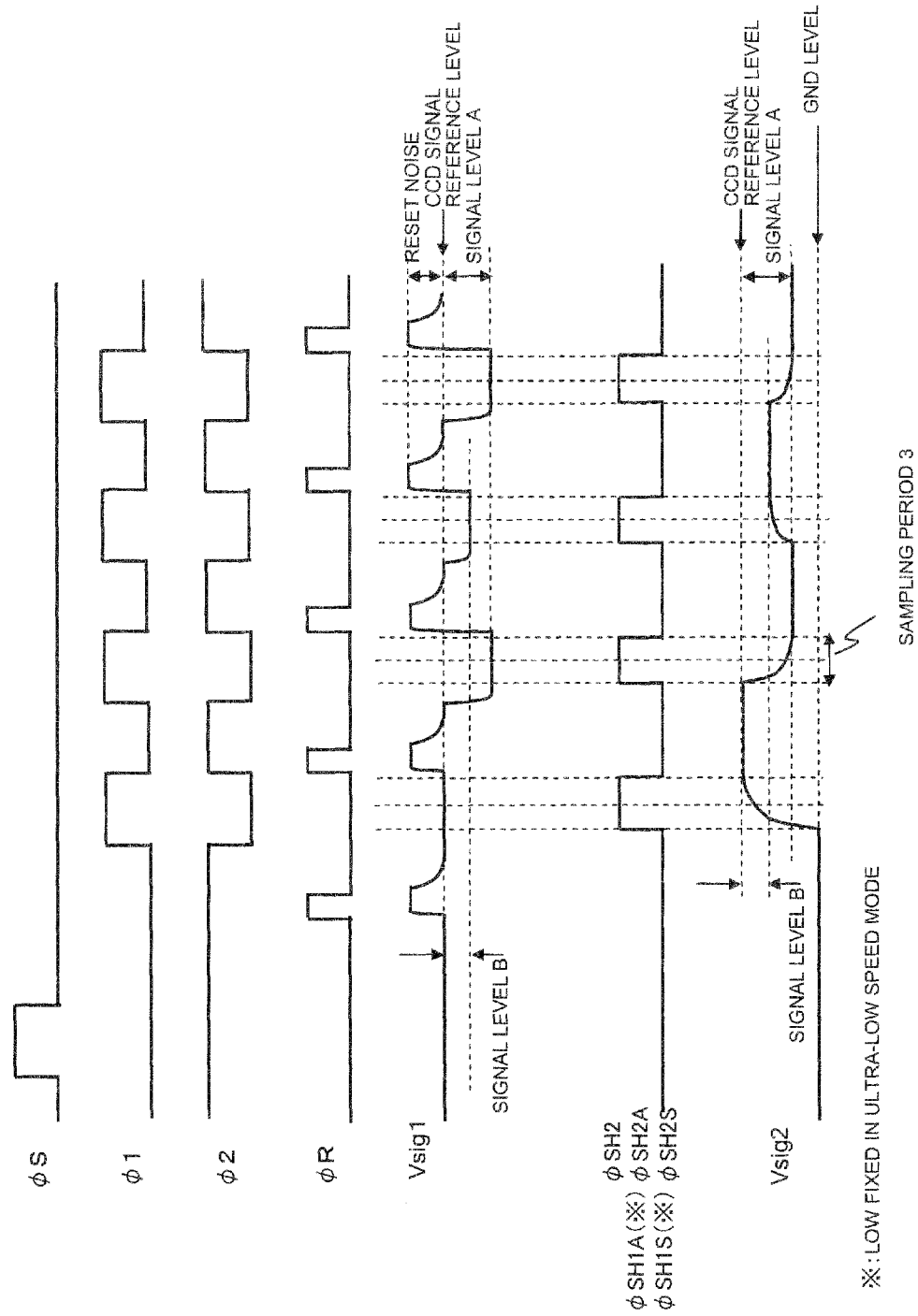
FIG. 7 is a timing chart of each part in a medium speed mode, a low speed mode and an ultra-low speed mode.

Next, a description is given concerning operation of the CCD image sensor, but first, as a premise, a description is given concerning signals related to the CCD 11. Phase relationships of the signal Vsig1 outputted from the buffer 12, and signals φS, φ1, φ2, and φR are shown in FIG. 3, FIG. 5, and FIG. 7. The signal Vsig1 in this example has a composition in which a charge signal from the CCD 11 is outputted at a point in time at which the signal φ2 goes to a LOW level; and has a waveform such that a signal is outputted as the signal φ2 falls, a signal charge is reset at a point in time at which the signal φR goes to a HIGH level, and a reset noise component is outputted at a point in time at which the signal φR goes to a LOW level. The signal φS is a shift pulse signal that transfers charge of each pixel to a CCD transfer register from the photodiode of the CCD 11, and has a period occurring for each transfer of all the number of pixels of the CCD 11, and when the signal φS is ON and the pixel signal charge is moved to the CCD transfer register, as in FIG. 3, FIG. 5, and FIG. 7, each clock signal of signals φ1, φ2, and φR is stopped.

Next, as an example of 5 operation modes, a more specific description is given concerning operation of the CCD image sensor. The 5 operation modes are each mode of (1) maximum speed, (2) high speed, (3) medium speed, (4) low speed, and (5) ultra-low speed, as shown in FIG. 2, and these respective modes comparatively represent drive speeds of the CCD 11. This is similar to drive speed of the timing pulse control circuit 21. Usage equivalent to a conventional example approximately corresponds to the high speed mode.

(1) Maximum Speed Mode

A description is given concerning the maximum speed mode. In the maximum speed mode, an external voltage supply and operation of a switch transistor are set, as shown in the maximum speed mode of FIG. 2. In this way, pulses of the signal φSH1 only, become the signals φSH1S and φSH2S after a direct current component cut (C cut), via the respective capacitor elements C1 and C2. FIG. 3 is a timing chart of each part in the maximum speed mode. Clock signals received by the gates of the sample-and-hold transistors MSH1 and MSH2 are identical, and have timing equivalent to the signal φSH1 that has a short pulse width. Therefore, it is possible to deal with higher speed operation than in a conventional example. FIG. 3 shows a CCD output waveform Vsig1 before sampling and holding, and an output waveform Vsig2 after sampling and holding. With regard to pulse voltage, the signal φSH2S also has a high voltage setting the same as the signal φSH1S of the high speed mode.

Next, a description is given concerning voltage of a pulse that has been set. As shown in FIG. 4, low level voltages of the signals φSH1S and φSH2S, at which the signal φS is active, are set respectively to voltages VSH1L and VSH2L that are higher than GND and lower than threshold voltages Vt1 and Vt2 of the sample-and-hold transistors MSH1 and MSH2. In this way, by setting the signal φSH1S and the signal φSH2S to a potential higher than a normal GND reference pulse, at a low level the sample-and-hold transistors MSH1S and MSH2S are in an OFF state, but at a high level both have an ON voltage VON1=VON2 higher than normal. Therefore, the sampling speed increases further, and sampling is possible at speeds higher than in the conventional example.

(2) High Speed Mode

Figure 6:
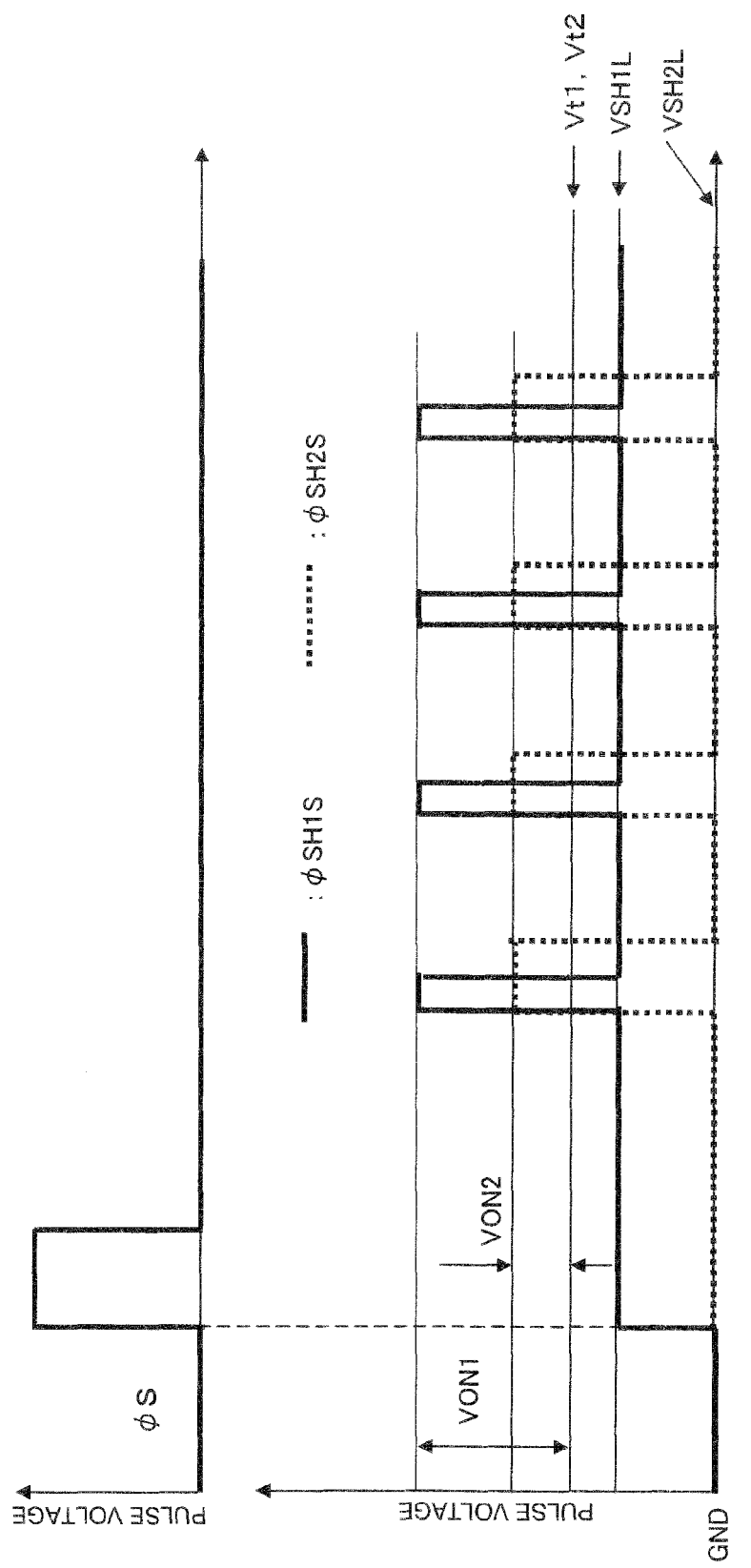
FIG. 6 is a drawing showing a waveform of gate voltage of a transistor for sampling and holding in the high speed mode.

A description is given concerning a high speed mode in which operation is performed approximately similarly to a conventional example. In the high speed mode, an external voltage supply and operation of a switch transistor are set, as shown in the high speed mode of FIG. 2. In this way, pulses of the signals φSH1 and φSH2 become the signals φSH1S and φSH2S after a direct current component cut (C cut), via the respective capacitor elements C1 and C2. FIG. 5 is a timing chart of each part in the high speed mode. With regard to the sample-and-hold pulse signals φSH1 and φSH2, the signal φSH1 is a pulse for sampling and holding at high speed, and the signal φSH2 is a pulse for inhibiting noise by time constant switching. However, in the conventional example, a pulse equivalent to the signal φSH2 has a high level at a point in time at which a pulse equivalent to the signal φSH1 has a low level. In contrast to this, here, in cases of driving in the same way as in the conventional example, with regard to timing at which the signals φSH1 and φSH2 have a high level at the same time, the sample-and-hold transistors MSH1 and MSH2 are turned ON at the same time, and the signals φSH1 and φSH2 have a low level, the signal φSH2 is delayed. Here, a high level period of the signal φSH1 is a sampling period 1, a high level period of the signal φSH2 is a sampling period 3, and a high level period of the signal φSH2 only is a sampling period 2. In this way, in FIG. 5, by turning the sample-and-hold transistors MSH1 and MSH2 ON at the same time only in the sampling period 1, it is possible to make the time constant of the sampling period 1 smaller than in the conventional example, and higher speed operation is possible. FIG. 5 shows a CCD output waveform Vsig1 before sampling and holding, and an output waveform Vsig2 after sampling and holding. In the exemplary embodiment, different from the conventional example, pulse voltage is such that φSH1>φSH2, as shown in FIG. 6.

Next, a description is given concerning voltage of a pulse that has been set. As shown in FIG. 6, first a low level voltage of the signal φSH1S, with the signal φS being active, is set to a voltage VSH1L that is higher than GND and lower than threshold voltages Vt1 and Vt2 of the sample-and-hold transistors MSH1 and MSH2. At the same time, a low level voltage of the signal φSH2S is set to VSH2L, which is a potential the same as GND. In this way, the signal φSH2S has a potential the same as the original signal φSH2. In this way, by having φSH1>φSH2, the sample-and-hold transistor MSH1 is in an OFF state at a low level, and at a high level has an ON voltage VON1 that is higher than an ON voltage VON2 of the sample-and-hold transistor MSH2S. That is, in the sampling period 1 there is a state in which an ON resistance in low, and in the sampling period 2 there is a state in which the ON resistance is high. Therefore, even if transistor sizes of the sample-and-hold transistors MSH1 and MSH2 are the same, time constant switching similar to the conventional example by difference of ON voltage is possible, and it is possible to reduce noise. The same can be said for this, even with timing the same as the conventional example.

(3) Medium Speed Mode

Figure 8:
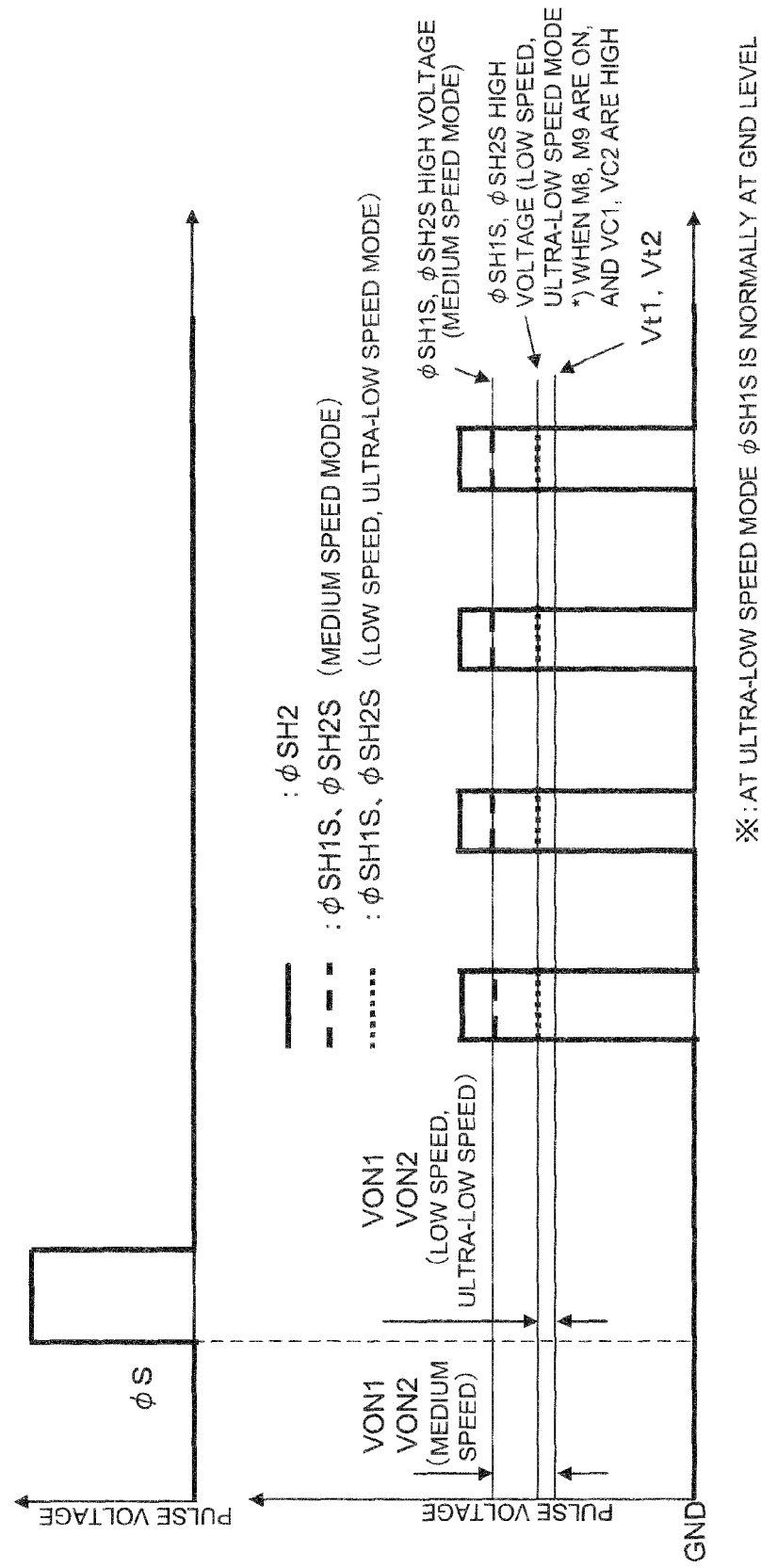
FIG. 8 is a drawing showing a waveform of gate voltage of a transistor for sampling and holding in the medium speed mode, the low speed mode, and the ultra-low speed mode.
Figure 9:
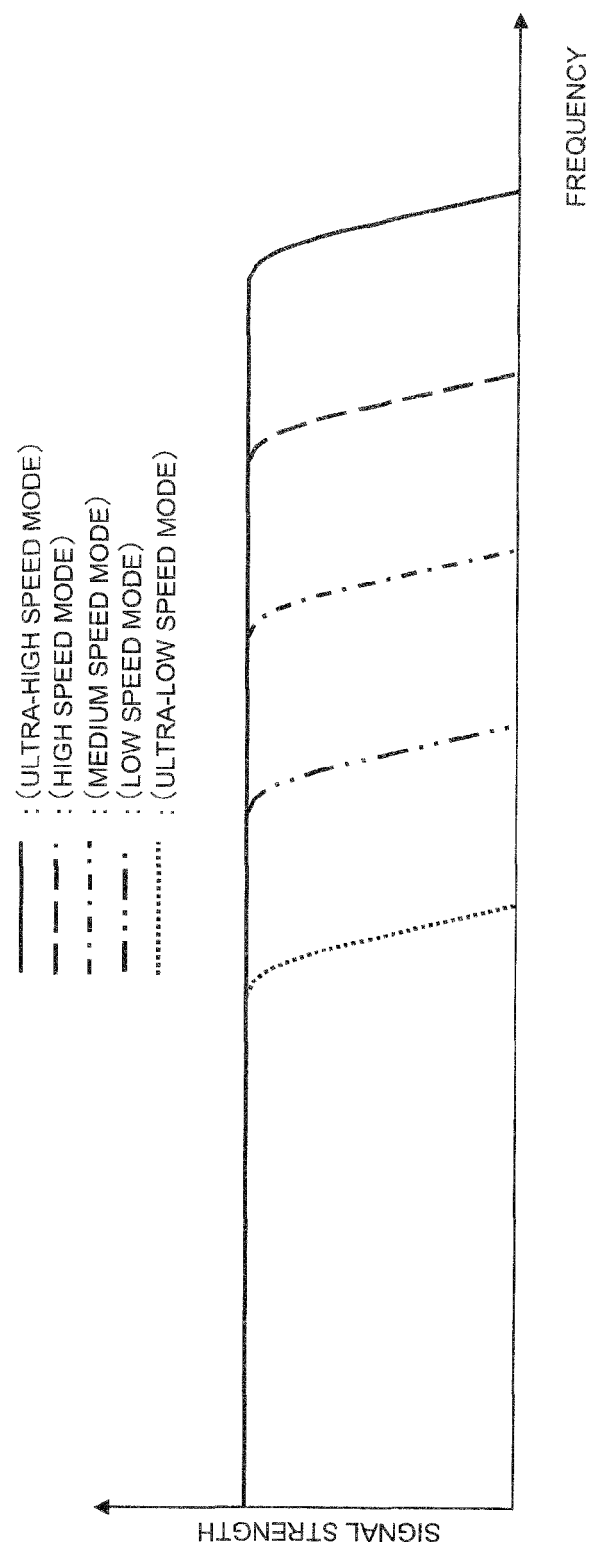
FIG. 9 is a drawing showing frequency characteristic in each mode according to time constant switching.
Figure 10:
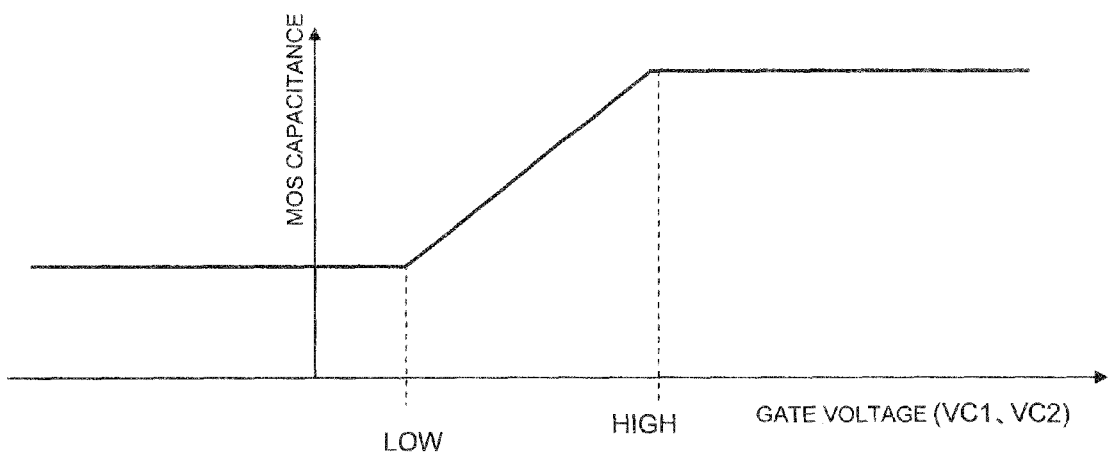
FIG. 10 is a drawing showing bias dependence of MOS capacitance.

Next, a description is given concerning a medium speed mode in which the drive speed is slower than in the high speed mode. In the medium speed mode, an external voltage supply and operation of a switch transistor are set, as shown in the medium speed mode of FIG. 2. In this way, pulses of the signal φSH2 only become the signals φSH1S and φSH2S after a direct current component cut (C cut), via the respective capacitor elements C1 and C2. FIG. 7 is a timing chart of each part in the medium speed mode. Clock signals received by the gates of the sample-and-hold transistors MSH1 and MSH2 are the same, and have timing equivalent to the signal φSH2 that has a long pulse width. FIG. 7 shows a CCD output waveform Vsig1 before sampling and holding, and an output waveform Vsig2 after sampling and holding. With regard to pulse voltage, the signals φSH1S and φSH2S are both the same as the original signal φSH2. However, in the medium speed mode, the switch transistors M8 and M9 of the pulse amplitude variation circuit 24 are ON, and the capacitor elements C1 and C2 are respectively connected to the MOS capacitors M6 and M7. Therefore, respective clock amplitudes of the signals φSH1S and φSH2S undergo capacitance division respectively by a capacitance value of the capacitor element C1 and the capacitance value C3 of the MOS capacitor M6, and a capacitance value of the capacitor element C2 and the capacitance value C4 of the MOS capacitor M7. By this division, as shown in FIG. 8, high level voltage of the signals φSH1S and φSH2S are higher than Vt1 and Vt2, but lower than a high level voltage of the original pulse signal φSH2, and in cases in which a normal GND reference clock is inputted, a time constant increases by the ON resistance increasing. However, voltages of the terminals VC1 and VC2 are low level voltages, and as shown in FIG. 10, the MOS capacitors have values comparatively lower than cases in which the voltages of the terminals VC1 and VC2 are at a high level. Therefore, voltage decrease at a high level due to division is comparatively small. In this way, in the medium speed mode, by raising the ON resistance of the sample-and-hold transistors MSH1 and MSH2, the time constant is increased more than with the high speed mode, and it is possible to decrease mixing-in of noise due to high frequency band limitation more than in the high speed mode, as shown in FIG. 9. In the medium speed mode, since sampling speed decreases by a sampling time constant increasing, this is not suitable for high speed driving, but is effective for low speeds more than the high speed mode.

(4) Low Speed Mode

Next, a description is given concerning a low speed mode in which the drive speed is slower than in the medium speed mode. In the low speed mode, an external voltage supply and operation of a switch transistor are set, as shown in the low speed mode of FIG. 2. In this way, operation timing and switching of the pulse amplitude variation circuit is the same as in the medium speed mode. However, in the low speed mode, the gate voltages of the MOS capacitors M6 and M7 of the pulse amplitude variation circuit 24 (voltages of the terminals VC1 and VC2) are high level voltages as shown in FIG. 10, and the capacitances of the MOS capacitors M6 and M7 are larger compared to the medium speed mode. Therefore, with regard to the medium speed mode, capacitance division is larger, and, as shown in FIG. 8, the decrease in high level voltage of the signals φSH1S and φSH2S is larger than in the medium speed mode. In this way, in the low speed mode, by further raising the ON resistance of the sample-and-hold transistors MSH1 and MSH2 more than in the medium speed mode, the time constant is increased more than in the medium speed mode, and it is possible to further decrease mixing-in of noise due to the high frequency band limitation more than the medium speed mode, as shown in FIG. 9. In the low speed mode, since sampling speed decreases by a sampling time constant increasing more than in the medium speed mode, this is effective for low speeds more than the medium speed mode.

(5) Ultra-Low Speed Mode

Next, a description is given concerning an ultra-low speed mode in which the drive speed is slower than in the low speed mode. In the ultra-low speed mode, an external voltage supply and operation of a switch transistor are set, as shown in the ultra-low speed mode of FIG. 2. In this way, operation timing and setting of the pulse amplitude variation circuit 24 are the same as in the low speed mode. However, by the MOS transistors M1 and M3 of the timing switch circuit 22 being OFF, the signal φSH1S is fixed at a low level. Therefore, since only the sample-and-hold transistor MSH2, which receives the signal φSH2S, is ON at sampling, the time constant increases more than in the low speed mode, and it is possible to further decrease the mixing-in of noise due to the high frequency band limitation, as shown in FIG. 9, more than in the low speed mode. In the ultra-low speed mode, since sampling speed decreases, by the sampling time constant increasing more than in the low speed mode, this is effective at a (ultra-low) speed lower than in the low speed mode.

A description divided into the 5 modes has been given above, but by combining voltage adjustment of pulse low level voltages by the timing switching circuit 22 and the pulse level shift circuit 23, and MOS capacitor voltage gate voltage adjustment of the pulse amplitude variation circuit 24, it is possible to vary the time constant in various ways outside of the abovementioned 5 modes.

Each disclosure of the above mentioned patent documents is incorporated by reference into the present document. Modifications and adjustments of the exemplary embodiments and examples are possible within the entire disclosure (including the scope of the claims) of the present invention and also based on fundamental technological ideas thereof. Furthermore, a wide variety of combinations and selections of various disclosed elements are possible within the scope of the claims of the present invention. That is, the present invention clearly includes every type of transformation and modification that a person skilled in the art can realize according to technological concepts and the entire disclosure including the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A sample-and-hold circuit, comprising:
   a switch element for performing sampling and holding an input signal, a magnitude of an ON resistance of the switch element in a sampling mode being set in accordance with a speed at which the input signal is sampled; and
   a level adjustment circuit which generates a sample-and-hold pulse signal to be provided to a gate of said switch element, the sample-and-hold pulse signal varying in voltage being based on the sampling speed to control the magnitude of the ON resistance of said switch element.

2. The sample-and-hold circuit according to claim 1, wherein said switch element is a MOS transistor.

3. The sample-and-hold circuit according to claim 2, further comprising:
   at least one additional MOS transistor,
   wherein said level adjustment circuit individually controls a gate voltage of each of said MOS transistors.

4. The sample-and-hold circuit according to claim 3, wherein said level adjustment circuit generates said sample-and-hold pulse signal with an amplitude and a level each corresponding to a speed classification of sampling.

5. The sample-and-hold circuit according to claim 1, wherein said level adjustment circuit generates said sample-and-hold pulse signal with an amplitude and a level each corresponding to a speed classification of sampling.

6. The sample-and-hold circuit according to claim 5,
   wherein said level adjustment circuit performs a level shift of each of a first and a second timing pulse signal, and
   wherein, with said sample-and-hold pulse signal having the amplitude attenuated or unchanged, said level adjustment circuit enables variation of any of a i) level shift amount and ii) an amplitude attenuation amount of said sample-and-hold pulse signal in accordance with the speed classification of sampling.

7. The sample-and-hold circuit according to claim 6, wherein said level adjustment circuit performs setting such that said first and said second timing pulse signals are identical signals.

8. The sample-and-hold circuit according to claim 6, wherein said level adjustment circuit performs setting such that said first and said second timing pulse signals are signals of different pulse widths made active at a same timing.

9. A CCD image sensor, comprising:
   a CCD, including a sample-and-hold circuit according to claim 1 configured to sample and hold an output signal of said CCD.

10. A sample-and-hold circuit, comprising:
    means for switching in two or more stages a magnitude of an ON resistance of a switch element for sampling an input signal at a predetermined sampling speed, the magnitude being switched according to the sampling speed,
    said means for switching comprises level adjustment means for generating a sample-and-hold pulse signal which varies a voltage to be provided to a gate of said switching means and controls the magnitude of the ON resistance of said switching means.

11. The sample-and-hold circuit according to claim 10, wherein said switch element comprises a MOS transistor.

12. The sample-and-hold circuit according to claim 11, further comprising:
    at least one additional MOS transistor,
    wherein said level adjustment means individually controls a gate voltage of each of said MOS transistors.

13. The sample-and-hold circuit according to claim 10, wherein said sample-and-hold pulse signal has an amplitude and a level each corresponding to a speed classification of sampling.

14. The sample-and-hold circuit according to claim 13,
    wherein said level adjustment means performs a level shift of each of a first and a second timing pulse signal, and
    wherein, with said sample-and-hold pulse signal having the amplitude attenuated or unchanged, enables variation of any of a i) level shift amount and ii) an amplitude attenuation amount of said sample-and-hold pulse signal in accordance with the speed classification of sampling.

15. The sample-and-hold circuit according to claim 14, wherein said level adjustment means performs setting such that said first and said second timing pulse signals are identical signals.

16. The sample-and-hold circuit according to claim 14, wherein said level adjustment means performs setting such that said first and said second timing pulse signals are signals of different pulse widths made active at a same timing.

17. A CCD image sensor, comprising:
    a CCD, including a sample-and-hold circuit according to claim 10 configured to sample and hold an output signal of said CCD.

* * * * *